(12) United States Patent
Mulkens et al.

(10) Patent No.: US 8,174,674 B2
(45) Date of Patent: *May 8, 2012

(54) LITHOGRAPHIC APPARATUS AND DEVICE MANUFACTURING METHOD

(75) Inventors: Johannes Catharinus Hubertus Mulkens, Waalre (NL); Johannes Jacobus Matheus Baselmans, Oirschot (NL); Paul Graupner, Aalen (DE); Erik Roelof Loopstra, Heeze (NL); Bob Streefkerk, Tilburg (NL)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 838 days.

This patent is subject to a terminal disclaimer.

(21) Appl. No.: 12/230,979

(22) Filed: Sep. 9, 2008

(65) Prior Publication Data

US 2009/0021707 A1 Jan. 22, 2009

Related U.S. Application Data

(63) Continuation of application No. 10/961,369, filed on Oct. 12, 2004, now Pat. No. 7,433,015.

(30) Foreign Application Priority Data

Oct. 15, 2003 (EP) ..................................... 03256499

(51) Int. Cl.
*G03B 27/52* (2006.01)
*G03B 27/32* (2006.01)

(52) U.S. Cl. ................ 355/55; 355/30; 355/77

(58) Field of Classification Search .................... 355/30, 355/53

See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A | 11/1984 | Takanashi et al. | |
| 4,493,533 A * | 1/1985 | Petrzilka et al. | 252/408.1 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Edward Glick
*Assistant Examiner* — Michelle Iacoletti
(74) *Attorney, Agent, or Firm* — Pillsbury Winthrop Shaw Pittman LLP

(57) ABSTRACT

An immersion lithography apparatus includes a liquid supply system configured to supply a liquid to a space through which a beam of radiation passes, the liquid having an optical property that can be tuned by a tuner. The space may be located between the projection system and the substrate. The tuner is arranged to adjust one or more properties of the liquid such as the shape, composition, refractive index and/or absorptivity as a function of space and/or time in order to change the imaging performance of the lithography apparatus.

38 Claims, 8 Drawing Sheets

U.S. PATENT DOCUMENTS

| | | | |
|---|---|---|---|
| 4,509,852 A | 4/1985 | Tabarelli et al. | |
| 5,040,020 A | 8/1991 | Rauschenbach et al. | |
| 5,577,552 A | 11/1996 | Ebinuma et al. | |
| 5,598,888 A | 2/1997 | Sullivan et al. | |
| 5,610,683 A | 3/1997 | Takahashi | |
| 5,715,039 A | 2/1998 | Fukuda et al. | |
| 5,825,043 A | 10/1998 | Suwa | |
| 5,883,704 A | 3/1999 | Nishi et al. | |
| 5,900,354 A | 5/1999 | Batchelder | |
| 6,191,429 B1 | 2/2001 | Suwa | |
| 6,236,634 B1 | 5/2001 | Lee et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,954,256 B2 | 10/2005 | Flagello et al. | |
| 7,098,290 B1 * | 8/2006 | Okoroafor et al. | 528/60 |
| 7,227,616 B2 | 6/2007 | Graeupner | |
| 7,352,435 B2 | 4/2008 | Streefkerk et al. | |
| 7,394,521 B2 | 7/2008 | Van Santen et al. | |
| 7,411,650 B2 | 8/2008 | Vogel et al. | |
| 7,420,652 B2 | 9/2008 | Niehoff | |
| 7,433,015 B2 * | 10/2008 | Mulkens et al. | 355/30 |
| 7,911,582 B2 | 3/2011 | Hirukawa et al. | |
| 2002/0006561 A1 | 1/2002 | Taniguchi | |
| 2002/0020821 A1 | 2/2002 | Van Santen et al. | |
| 2002/0163629 A1 | 11/2002 | Switkes et al. | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0119954 A1 | 6/2004 | Kawashima et al. | |
| 2004/0125351 A1 | 7/2004 | Krautschik | |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2005/0110973 A1 | 5/2005 | Streefkerk et al. | |
| 2005/0132914 A1 | 6/2005 | Mulkens et al. | |
| 2007/0252961 A1 * | 11/2007 | Novak et al. | 355/30 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 6-168866 | 6/1994 |
| JP | 07-132262 | 5/1995 |
| JP | 07-220990 | 8/1995 |
| JP | 10-12515 | 1/1998 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-301825 | 10/2004 |
| JP | 2005-12201 | 1/2005 |
| JP | 2005-12228 | 1/2005 |
| JP | 2005-79589 | 3/2005 |
| JP | 2005-123305 | 5/2005 |
| JP | 2006-509357 | 3/2006 |
| JP | 2007-507094 | 3/2007 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol. B., vol. 10, No. 6, Nov./Dec. 1992, pp. 3032-3036.

H. Hogan, "New Semiconductor Lithography Makes a Splash", PHOTONICS SPECTRA, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Search Report for European Application No. 03256499.9, dated Sep. 17, 2004.

http://dictionary.reference.com/browse/temperature.

http://en.wikipedia.org/wiki/Velocity.

http://www.glenbrook.k12.il.us/GBSSCI/PHYS/Class/energy/u5l1c.html.

University of Richmond, Refractive Index, 1996, http://web.uccs.edu/bgaddis/chem337/expts/nD/nD.htm.

Japanese Office Action mailed Jun. 14, 2011 in corresponding Japanese Patent Application No. 2008-274669.

\* cited by examiner

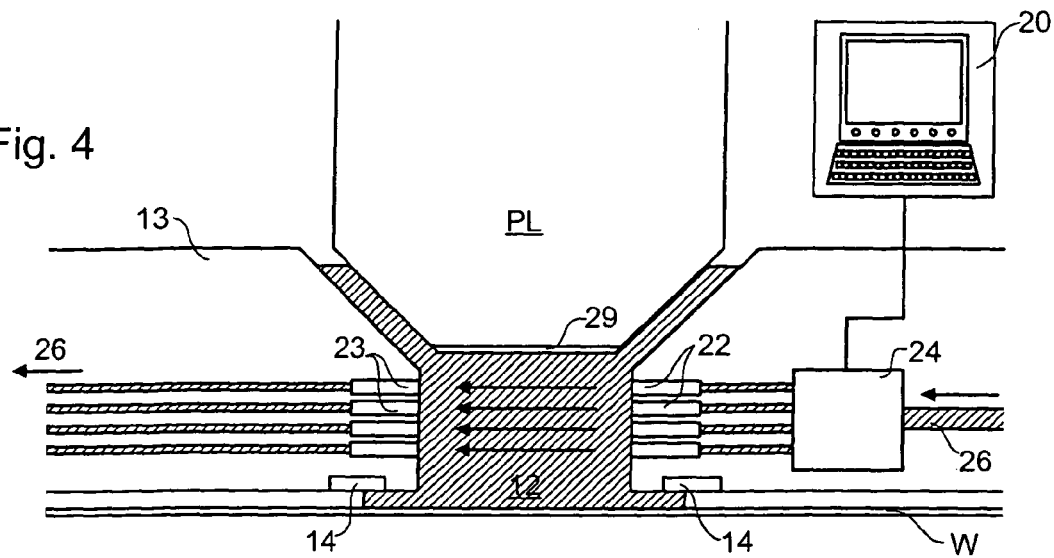
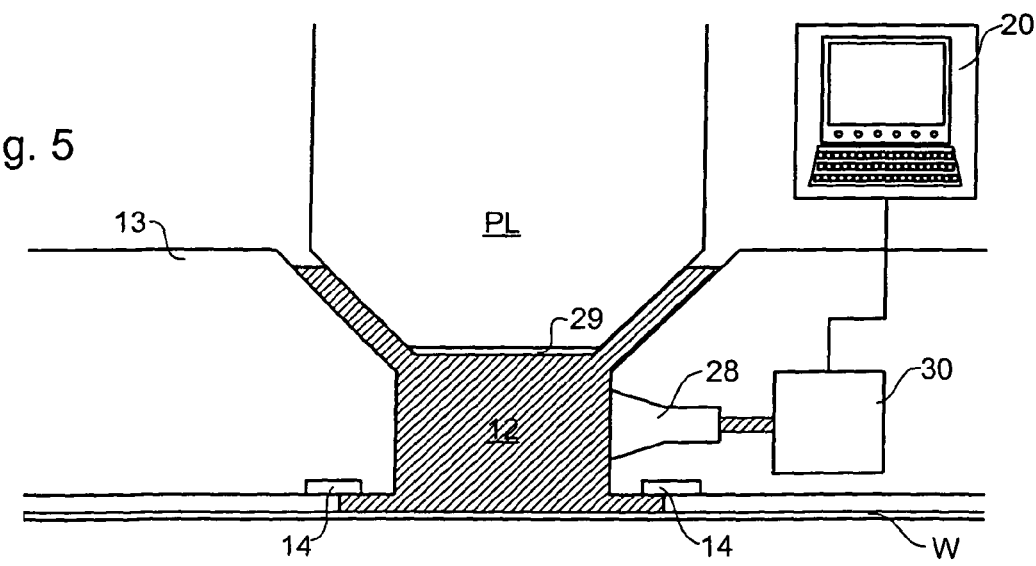

LITHOGRAPHIC APPARATUS AND DEVICE MANUFACTURING METHOD

The present application is a continuation of co-pending U.S. patent application Ser. No. 10/961,369, filed on Oct. 12, 2004 now U.S. Pat. No. 7,433,015, now allowed, which claims priority to European Patent Application No. EP 03256499.9, filed Oct. 15, 2003, the entire contents of each of the foregoing applications herein fully incorporated by reference.

FIELD

The present invention relates to a lithographic projection apparatus and a device manufacturing method.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system, including refractive optics, reflective optics, and catadioptric systems, for example. The radiation system and projection system may include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and outlets positioned around the final element are possible, one example is illustrated in FIG. 3 in which four sets of an inlet with an outlet on either side are provided in a regular pattern around the final element.

SUMMARY

As system resolution is improved, it becomes increasingly difficult and expensive to control lens aberrations and focus. The introduction of an immersion liquid in an immersion lithography apparatus has made the task more difficult because the optical properties of the liquid are complex and sensitive to small variations in temperature and contaminant concentration, both of which may change with time and position.

Accordingly, it would be advantageous, for example, to control more efficiently the optical performance of an immersion lithography projection system.

According to an aspect of the invention, there is provided a lithographic projection apparatus, comprising:

an illumination system configured to condition beam of radiation;

a support structure configured to hold a patterning device, the patterning device configured to pattern the beam of radiation according to a desired pattern;

a substrate table configured to hold a substrate;

a projection system configured to project the patterned beam onto a target portion of the substrate;

a liquid supply system configured to supply a liquid to a space through which the beam of radiation passes, the liquid having an optical property that can be tuned; and a tuner configured tune the optical property.

Imaging radiation may be influenced by one or more portions of liquid encountered prior to the substrate. By providing a tuner to tune one or more optical properties of these one or more portions and, in an embodiment, use them as a liquid lens(es), it is possible to achieve flexible and dynamic control over imaging performance of the lithographic apparatus. The nature of liquid allows tuning modes that are not possible with a conventional solid lens or other optical element.

An embodiment of the invention may be applied to both immersion and non-immersion lithographic projection apparatus. Where an embodiment relates to an immersion lithographic apparatus, the liquid supply system of the apparatus may configured to at least partly fill a space between the projection system and the substrate with a liquid, and the optical property of the liquid in that space may be tuned. An advantage of using the liquid in the space between the projection system and the substrate is that no new volume of liquid needs to be introduced into the apparatus. Additionally, one or more optical properties of that liquid are brought under control, thus removing a need for extensive adjustments to the projection system to allow for that liquid. As an exemplary embodiment, the liquid may be used to compensate for one or more specific problems in the projection system. This approach has an advantage of reducing the need for complex and costly features such as internal lens manipulators (e.g. Z-manipulators, ALE-manipulators), which might otherwise be required to tune the projection system. Where such lens manipulators are still required, an embodiment of the present invention may reduce the range through which they are required to operate. The liquid may also provide an alternative to using calcium fluoride ($CaF_2$) for image/lens color correction.

The tuner may be arranged to control spatial dependence of the optical property of the liquid in the space, creating an uniform offset or spatially varying optical property profile. One or more anamorphic imaging effects (e.g. astigmatism offset, asymmetric lens magnification) may be compensated by creating an anamorphic optical property profile (i.e. a profile wherein an optical property is different along two orthogonal directions). This configuration can be used to compensate a lens heating induced effect.

The tuner may be arranged to provide and control a time-varying optical property of the liquid in the space. Changing a temperature profile with time, for example, coordinated with scanning movement of the substrate relative to the projection system, can induce a lateral refractive index variation which can be used to compensate image tilt/curvature and/or distortion effects.

The tuner may comprise a liquid temperature controller configured to control a temperature profile, and thereby one or more properties including a refractive index profile, an absorptivity profile, or both, of the liquid in the space. The refractive index profile affects the path the radiation takes through the liquid and can thus be used to control one or more geometric features of the image such as focus and/or aberration. Temperature provides a highly flexible means of control. Controlling the temperature profile may also affect one or more dynamic properties of the liquid by influencing viscosity and/or by introducing convective currents.

The temperature controller may comprise one or more heat exchangers configured to establish a homogeneous or non-uniform temperature profile within the liquid in the space. Each heat exchanger can act to add heat to the liquid or to remove heat from the liquid.

In an embodiment, the temperature controller may comprise a plurality of independent heat exchangers arranged at different heights, radii and/or angles relative to an axis lying in a plane substantially parallel to the substrate.

The one or more heat exchangers may be arranged to add heat to or remove heat from, but not exchange liquid with, the liquid in the space. One or more heat exchangers thus arranged may comprise an element which is immersed in the liquid and maintained at a temperature higher or lower than that of the liquid according to whether or not it is required respectively to add or remove heat.

In an embodiment, the one or more heat exchangers may be arranged to add heat to or remove heat from, and exchange temperature conditioned liquid with, the liquid in the space. One or more heat exchangers that do not exchange liquid with the liquid in the space rely on thermal conduction and convection currents to transport heat, which may lead to delays and unpredictability. By designing the one or more heat exchangers to create currents of temperature controlled liquid, the temperature profile may be adjusted more quickly and accurately. As an exemplary embodiment, the one or more heat exchangers may be arranged in pairs, with a first element of each pair adding temperature conditioned liquid and a second element removing liquid. Each pair may further be arranged to be aligned in a plane substantially parallel to the plane of the substrate. In this way, more efficient heat transfer may be achieved. In addition, an uniform controlled flow of liquid substantially parallel to the substrate may be provided that allows more predictable and homogeneous optical properties by reducing convection currents, turbulence and the like.

The one or more heat exchangers may be coupled with the liquid supply system for effecting the exchange of temperature conditioned liquid. This arrangement may be cost effective from a manufacturing perspective since the liquid supply system may already be arranged to supply a controlled flow of liquid, for example, to a space between the projection system and the substrate.

The tuner may comprise a liquid pressure controller configured to control the pressure, and thereby one or more properties including the refractive index and/or absorptivity, of the liquid in the space. The use of pressure has an advantage of high stability and predictability.

The tuner may comprise a liquid geometry controller configured to control a shape of the liquid in the space. The liquid geometry controller may operate in combination with the liquid pressure controller to vary one or more imaging properties of the liquid. Varying the shape of the liquid in the space in this manner allows flexible tuning and may provide a highly stable liquid lens environment.

The liquid geometry controller may control the thickness of the liquid in the space in a direction substantially parallel to the axis of a final element of the projection system. Increasing the relative thickness of the liquid in this way may be used to control spherical aberration, for example. This mode has an advantage of providing an additional means to compensate spherical aberration offset, which can normally be adjusted only over a limited range. For example, Z-manipulators eventually cause cross talk to other aberrations.

The tuner may comprise a liquid composition controller configured to control the composition, and thereby one or more properties including the refractive index and/or absorptivity, of the liquid in the space.

The liquid composition controller may comprise one or more particle exchange configured to add impurity ions to and/or remove impurity ions from the liquid in the space. The liquid composition controller may be coupled with the liquid supply system to provide one or more purity conditioned influxes of liquid.

The liquid composition controller may be arranged to replace a first liquid in the space with a second liquid of different composition. Water, ethanol, acetone and benzoate are examples of substances that may be used for either of the first or second liquids. In an embodiment, completely refreshing the liquid in the space provides increased control and scope for image manipulation.

The lithographic projection apparatus may further comprise one or more liquid sensors configured to measure, as a function of position and/or time, a property of the liquid in the space including any one or more of the following: temperature, pressure, boundary geometry, composition, refractive index and absorptivity. Additionally, the apparatus may comprise a device configured to correct the focus of the apparatus as a function of the refractive index profile of the liquid in the space, as measured by the one or more liquid sensors. A variation in focus is significantly dependent on a variation of the refractive index of the liquid. By concentrating on a significant physical property, this device may improve the efficiency with which focus in the lithographic apparatus may be controlled.

In an embodiment, the apparatus may comprise a device configured to correct an exposure dose of the apparatus as a function of the absorptivity profile of the liquid in the space, as measured by the one or more liquid sensors. A variation in radiation intensity reaching the substrate is significantly dependent on a variation in the absorptivity of the liquid. By concentrating on a significant physical property, this device may improve the efficiency with which exposure dose in the lithographic apparatus may be controlled An approach of adjusting one or more optical properties of the projection system to compensate for a liquid in a space between the projection system and the substrate without making reference to in situ measurement of one or more properties of the liquid, requires exploration of a large parameter space and may therefore be time consuming and costly. Liquids for immersion lithography typically have various physical properties, including dynamic ones caused by system flow and convection, that each influence the optical performance in different ways. According to an embodiment of the invention when applied to a liquid in a space between the projection system and the substrate, combining in situ measurement of one or more liquid properties with a knowledge of how each property influences a particular aspect of the optical performance of the projection system allows more efficient tuning of the projection system.

The tuner may be arranged to create an optical effect including spherical aberration and/or field curvature. This feature may be used to compensate for spherical aberration and/or field curvature originating in the projection system, and thus obviate the need for additional internal lens manipulators or other adjustment devices.

The tuner may comprise a computer controller configured to calculate the required size of correction to one or more optical properties of the projection system and/or the liquid based on a measured property. This approach obviates the need for extensive experimental tests to determine how the system may respond to adjustment of a refractive index and/or absorptivity profile. The computer controller may obtain an estimate for such a response via a computer model of the projection system and the liquid (which may or may not be simplified) that provides exact or numerical solution of relevant physical equations According to a further aspect of the invention, there is provided a device manufacturing method, comprising:

providing a liquid in a space through which a beam of radiation passes;

tuning an optical property of the liquid in the space; and projecting the beam of radiation as patterned by a patterning device onto a target portion of a substrate.

According to an aspect of the invention, there is provided a lithographic projection apparatus, comprising:

an illumination system configured to condition beam of radiation;

a support structure configured to hold a patterning device, the patterning device configured to pattern the beam of radiation according to a desired pattern;

a substrate table configured to hold a substrate;

a projection system configured to project the patterned beam onto a target portion of the substrate;

a lens formed from a liquid and having an optical property that can be tuned; and a tuner configured tune the optical property.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a projection apparatus comprising a temperature profile controller according to an embodiment of the invention;

FIG. 5 depicts a projection apparatus comprising a liquid composition controller according to an embodiment of the invention;

DETAILED DESCRIPTION

Figure 1:
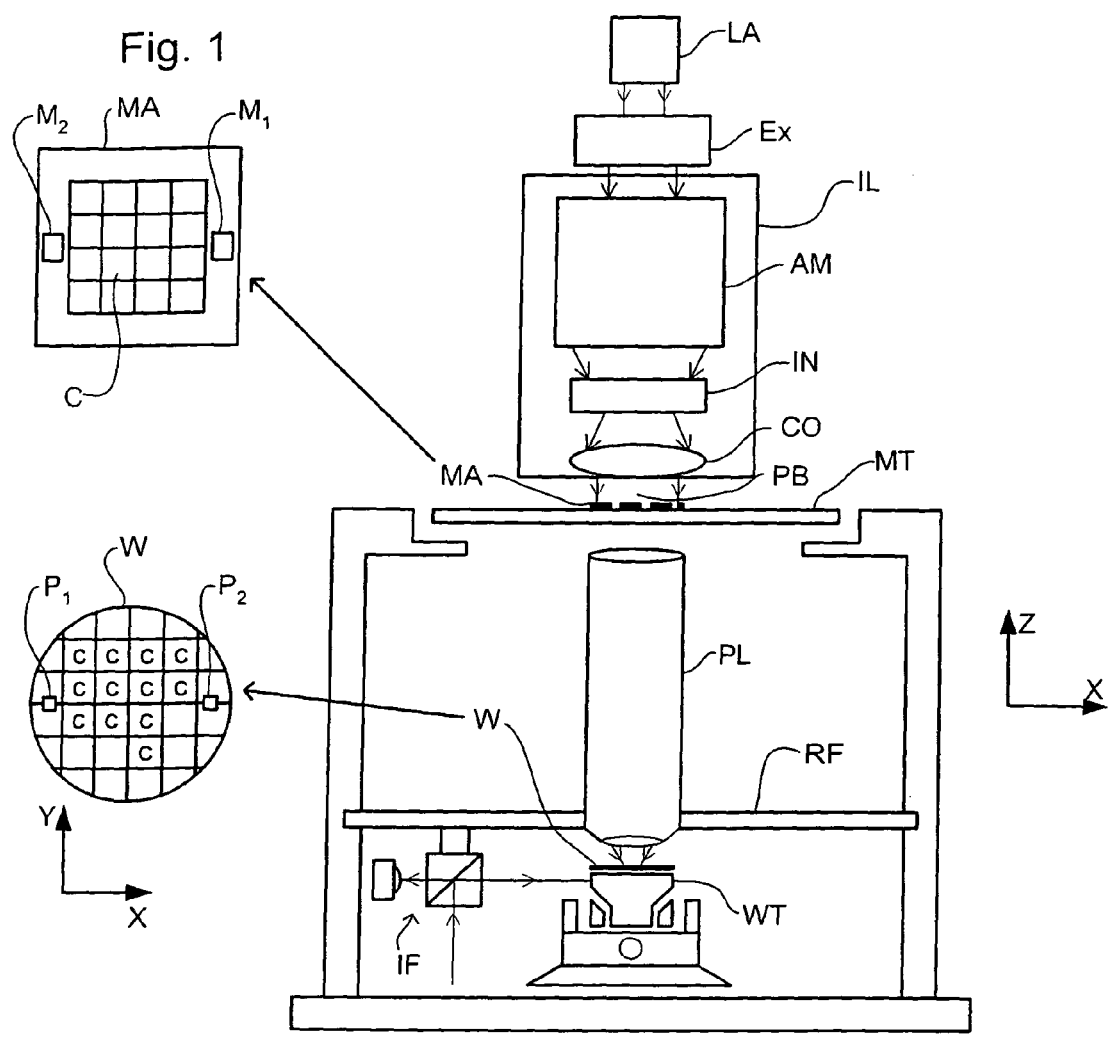
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, configured to supply a projection beam PB of radiation (e.g. DUV radiation), which in this particular case also comprises a radiation source LA;

a first object table (mask table) MT provided with a mask holder configured to hold a mask MA (e.g. a reticle), and connected to a first positioner configured to accurately position the mask with respect to item PL;

a second object table (substrate table) WT provided with a substrate holder configured to hold a substrate W (e.g. a resist-coated silicon wafer), and connected to a second positioner configured to accurately position the substrate with respect to item PL;

a projection system ("projection lens") PL (e.g. a refractive system) configured to image an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioner (and an interferometric measuring device IF), the substrate table WT can be moved accurately, e.g. so as to position different target portions C in the path of the beam PB. Similarly, the first positioner can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at one time (i.e. a single "flash") onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 2:
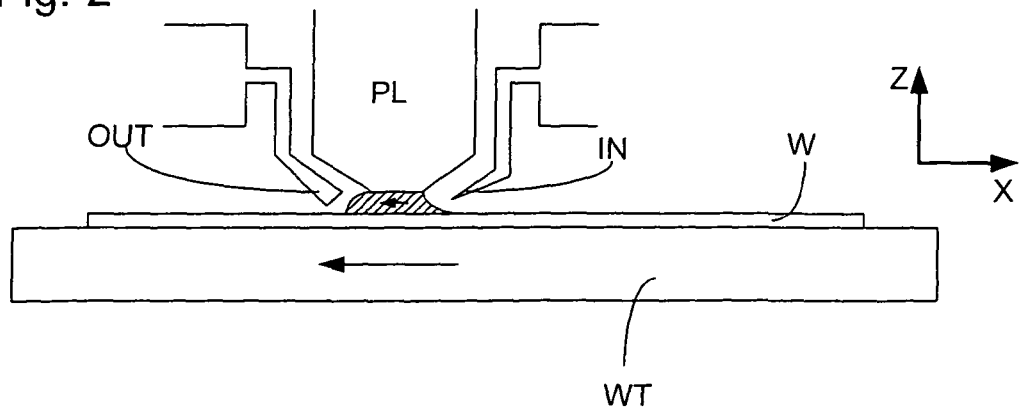
FIG. 2 depicts a liquid supply system for supplying liquid to the area around the final element of the projection system according to an embodiment of the invention.
Figure 3:
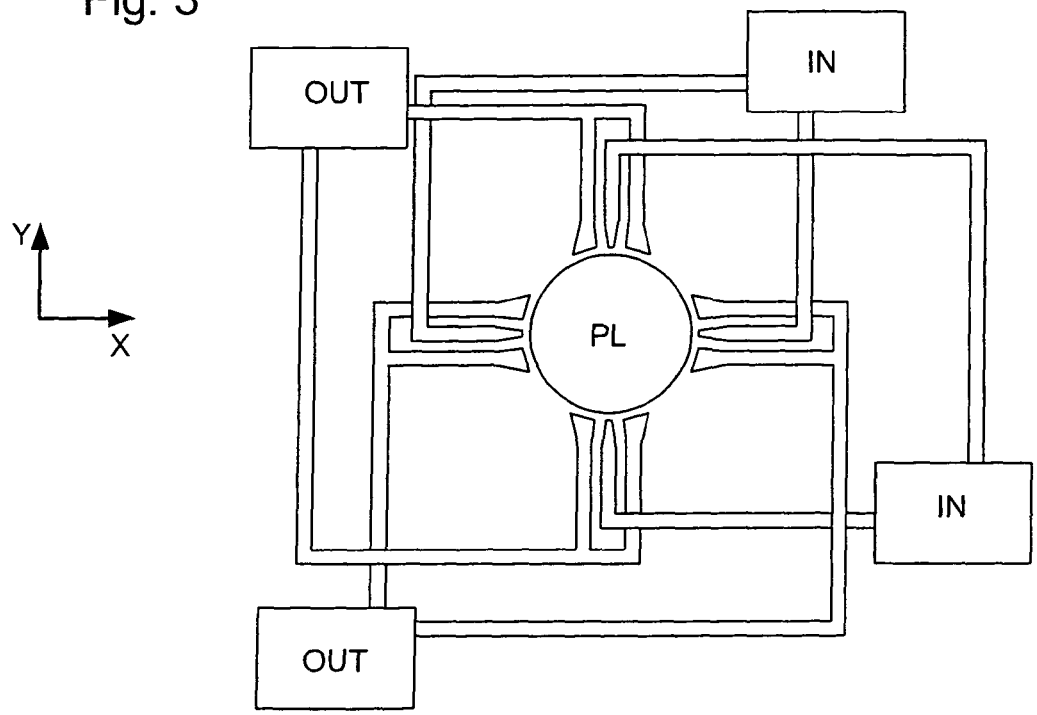
FIG. 3 depicts the arrangement of inlets and outlets of the liquid supply system of FIG. 2 around the final element of the projection system according to an embodiment of the invention.

FIGS. 2 and 3 depict a liquid supply system according to an embodiment of the invention and have been described above. Another liquid supply system solution according to an embodiment of the invention is a liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system is disclosed in U.S. patent application no. U.S. Ser. No. 10/705,783, hereby incorporated in its entirety by reference. Other liquid supply systems may be employed according to embodiments of the invention including, without limitation, a bath of liquid.

FIGS. 4 to 10 show a liquid in a space through which a beam of radiation passes according to embodiments of the invention in which an immersion liquid, used for immersion lithography, is used as the liquid. In an embodiment, the liquid in the space forms a liquid lens. A liquid supply system supplies liquid to an imaging-field reservoir 12 between the projection system PL and the substrate W. In an embodiment, the liquid is chosen to have a refractive index substantially greater than 1, meaning that the wavelength of the projection beam is shorter in the liquid than in air or a vacuum, allowing smaller features to be resolved. It is well known that the resolution of a projection system is determined, inter alia, by the wavelength of the projection beam and the numerical aperture of the system. The presence of the liquid may also be regarded as increasing the effective numerical aperture.

The reservoir 12 is bounded at least in part by a seal member 13 positioned below and surrounding the final element of the projection system PL. The seal member 13 extends a little above the final element of the projection system PL and the liquid level rises above the bottom end of the final element of the projection system PL. The seal member 13 has an inner periphery that at the upper end closely conforms to the step of the projection system or the final element thereof and may, e.g., be round. At the bottom, the inner periphery closely conforms to the shape of the image field, e.g. rectangular but may be any shape.

Between the seal member 13 and the substrate W, the liquid can be confined to the reservoir by a contact-less seal 14, such as a gas seal formed by gas provided under pressure to the gap between the seal member 13 and the substrate W. The liquid may be arranged to be circulated or remain stagnant.

FIG. 4 illustrates an embodiment of the invention in which a tuner comprises a temperature profile controller 24. The temperature profile of the liquid influences predominantly the refractive index profile but localized heating/cooling may also influence properties such as absorptivity and viscosity. The temperature profile controller 24 may comprise an array of heat exchangers (22,23), which are capable of heating or cooling the liquid. The heat exchangers may work by contact means only (acting locally), or act to supply a flow of temperature conditioned liquid. In the example shown in FIG. 4, an array of heat exchangers (22,23) provides temperature conditioned liquid via inlets 22 and outlets 23 arranged in pairs. Liquid may be made to circulate in a closed circuit 26 from temperature profile controller 24 through heat exchanger inlets 22 into the reservoir 12 and then back into the closed circuit 26 via the heat exchanger outlets 23.

The result in this embodiment is a horizontal flow of temperature conditioned liquid that may support axial (i.e. parallel to the axis of the final element of the projection system PL) temperature gradients with reduced convection currents. The arrangement shown is appropriate for maintaining such axial temperature gradients. However, radial (from an extension of the axis of the final element of the projection system PL) temperature gradients may be created or controlled via an analogous arrangement of heat exchangers arranged at different radii, and more complex currents may be handled by locating inlets and outlets at different azimuthal angles (i.e. angles relative to a fixed direction in a plane parallel to the substrate W). It is also possible to provide a time-varying temperature profile. This may be done in cooperation with scanning movements of the substrate W and a lateral refractive index can be induced, along with accompanying image tilt/curvature and distortion effects.

The inlets 22 and outlets 23 may be coupled with a liquid supply system such as that depicted in FIG. 3. In this example, four groups of ducts are arranged, each angularly spaced from its neighbors by 90°. However, any number of ducts (inlets/outlets) may be used at various temperatures, pressures, heights and angular positions for the purposes of tuning one or more optical properties of the immersion liquid.

FIG. 5 shows a further embodiment wherein the tuner comprises a liquid composition controller 30. The liquid composition controller 30 may add or remove impurity ions from the immersion liquid in order to influence properties such as the refractive index profile or absorptivity. In the example shown, a single particle exchanger 28 is shown but a plurality of particle exchangers 28 may be arranged around the reservoir 12 if it is required to create impurity concentration gradients. Additionally or alternatively, one or more particle exchangers 28 may be arranged to control impurities that arise predominantly from particular areas of the reservoir 12 boundary, such as near the substrate W. Again, as for the temperature profile controller 24, the liquid composition controller 30 may be coupled with a liquid supply system such as that depicted in FIG. 3.

Additionally or alternatively, a liquid of a different composition may be added. The second liquid may be mixed with liquid already in the space or be arranged to replace the original liquid. Examples of liquids that may be used include: water, ethanol, acetone and benzoate.

In each case herein, the operation of the tuner may be controlled by a computer 20 that calculates the required change in the physical parameter in question via an abstract computer model of the projection apparatus.

The tuner may be used to create spherical aberration and/or field curvature effects in the liquid in the space. Refractive index changes of between several ppm (parts/million) and several hundred ppm may be used to create such effect(s). For water at 22° C., the rate of change of refractive index with temperature, dn/dT, is 100 ppm/K. Therefore, changing the refractive index in steps of 50 ppm would require temperature steps of 0.5 K. For a typical lens design (variations would be expected between systems of different numerical aperture), this would result in 10-20 nm focus steps and about 1 nm Z9 spherical aberration. The influence of contamination will typically yield approximately 1 ppm change in refractive index for a 1 ppm change in impurity concentration. For acetone in water the effect is stronger, with an index change measured at 10 ppm for a 1 ppm addition of acetone.

Figure 6:
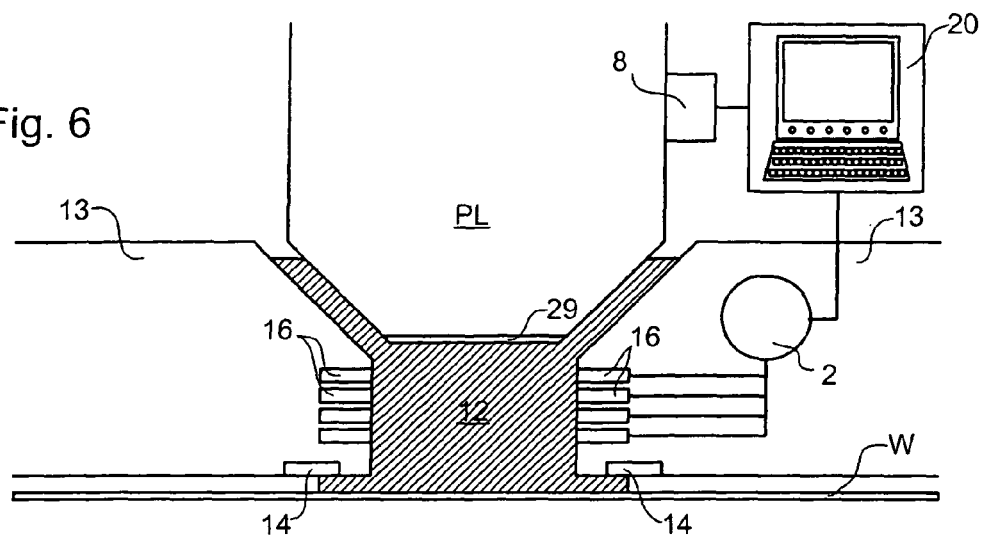
FIG. 6 depicts a projection apparatus comprising a refractive index measurement device configured to measure the refractive index profile of the immersion liquid according to an embodiment of the invention.

FIG. 6 depicts a projection apparatus comprising a measurement device 2 configured to measure the refractive index profile of the liquid according to an embodiment of the invention. Refractive index sensors 16, connected to the device 2, are arranged around the sides of the liquid reservoir 12. Such an arrangement is advantageous where the axial variation in refractive index is required. The radial variation may be determined by positioning sensors 16 at different radii. Sensors that measure through the projection system be used for this purpose.

Figure 7:
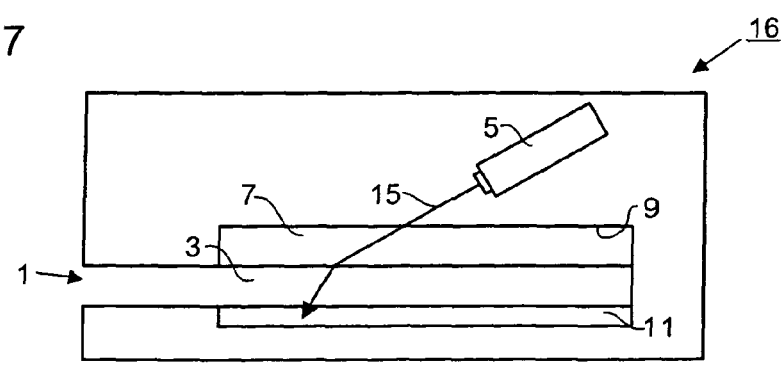
FIG. 7 depicts a schematic arrangement for the refractive index sensor of FIG. 6.

FIG. 7 shows a schematic arrangement for a refractive index sensor 16. Small quantities of liquid are extracted from the reservoir 12 via the testing inlet 1 to fill a testing chamber 3. Well collimated light from a light source 5 is arranged to pass through a control medium 7 of known refractive index at a fixed angle to the interface between the control medium reservoir 9 and the testing chamber 3. The light source 5 may be a low power laser, for example. Light passes through the control medium 7 and the immersion liquid in the chamber 3 and is detected by a position sensitive optical sensor 11 (see example beam path 15). The angle to the normal is calculated and the refractive index extracted using Snell's Law.

Figure 8:
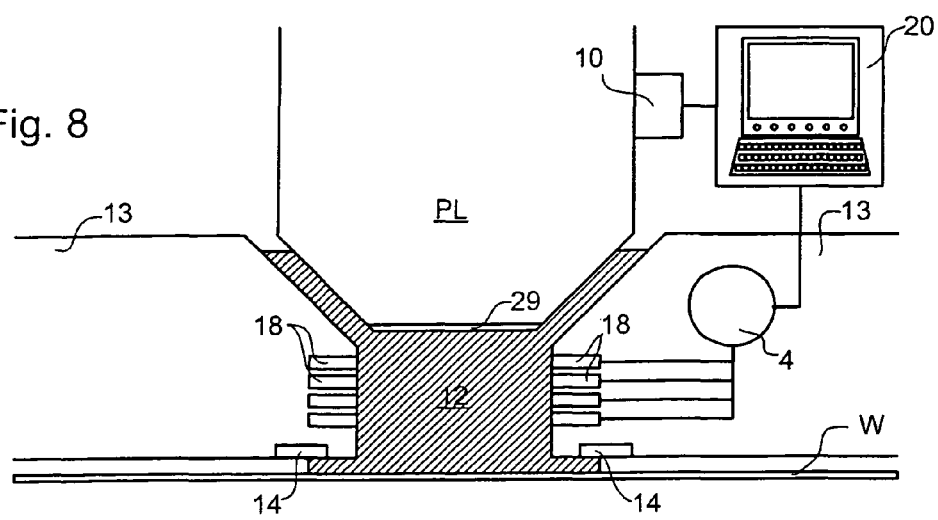
FIG. 8 depicts a projection apparatus comprising an absorptivity measurement device configured to measure the absorptivity profile of the immersion liquid according to an embodiment of the invention.

FIG. 8 depicts a projection apparatus comprising a measurement device 4 configured to measure the absorptivity profile of the liquid according to an embodiment of the invention. Absorptivity sensors 18 are arranged in a pairwise fashion around the sides of the liquid reservoir 12 with one element of each sensor pair acting as transmitter and the other as a receiver. The sensors are arranged to be level with each other (in a plane substantially parallel to that of the substrate). The absorptivity is derived by measuring the light attenuation due to propagation across the reservoir 12 of a light beam directed from the transmitter of a sensor pair 18 to the matching receiver of the sensor pair 18. The arrangement depicted is appropriate for measuring axial variations in the absorptivity profile and for establishing the average overall absorptivity. Sensors 18 may be arranged at different radii to measure any radial dependence in the absorptivity and/or arranged to measure through the projection system.

Figure 9:
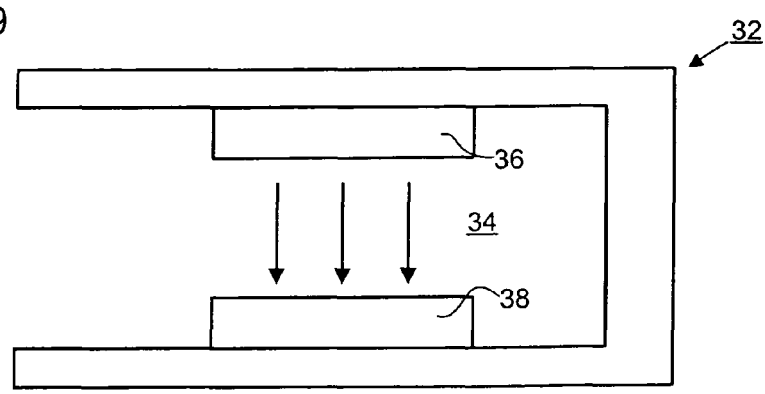
FIG. 9 depicts a schematic arrangement for an absorptivity sensor according to an embodiment of the invention.

The absorptivity may also be measured by individual sensors, which allows more localized measurements of the absorptivity. FIG. 9 depicts an arrangement for such a sensor 32. Here, a small quantity of immersion liquid is removed from the reservoir 12 into an absorptivity testing chamber 34. The absorptivity is derived by monitoring signal attenuation between a transmitter 36 and receiver 38.

The measurement device 2, 4 may also comprise one or more sensors configured to measure primary properties such as pressure, temperature, boundary geometry and/or composition. Calibration of one or more of these properties may be carried out by reference to sensors forming part of the lithographic apparatus (e.g. focus, aberration and/or dose sensors). Focus, aberration and/or dose sensors may be integrated into a wet substrate stage. However, in order to generate useful information, optical measurements using these sensors have to be performed at the imaging wavelength. Therefore, in an embodiment, such measurements are made offline (i.e. not during imaging) so as not to create stray radiation that could damage the image.

In those sensors described above that extract immersion liquid from the reservoir 12, a mechanism may also be included to purge and replenish the liquid sample.

In FIGS. 6 and 8, the refractive index measurement device 2 and absorptivity measurement device 4 are coupled respectively to one or more devices configured to correct the focus 8 and/or exposure dose 10 of the projection apparatus via a computer 20. The computer 20 calculates, based on the measured property(ies), what changes to the focus and/or exposure dose need to be made. This calculation may be carried out based on a feedback mechanism, with a PID (proportional-integral-differential) controller to ensure optimal convergence of the focus and/or exposure dose towards target value(s). Alternatively or additionally, it may be efficient to utilize a feed-forward arrangement using one or more sensors that are already present in the substrate holder such as a transmission image sensor (TIS), a spot sensor and an integrated lens interferometer at scanner (ILIAS). Alternatively or additionally, the computer may calculate the appropriate correction(s) based on an abstract mathematical model of the projection system and immersion liquid. An advantage of the above arrangements is that they explicitly take into account the physical influence of each property of the immersion liquid. In the examples described, the absorptivity of the liquid is recognized to be significant predominantly in relation to exposure dose, while the refractive index profile is recognized to be significant in relation to focus. Other physical properties may be treated in an analogous way. For example, one or dynamic effects linked with motion of the immersion liquid may also affect focus, exposure dose and/or other performance related features of the projection apparatus. These one or more effects may also be tackled via computer modeling using a similar algorithm as used to model the influence of liquid absorptivity and/or refractive index.

Figure 10:
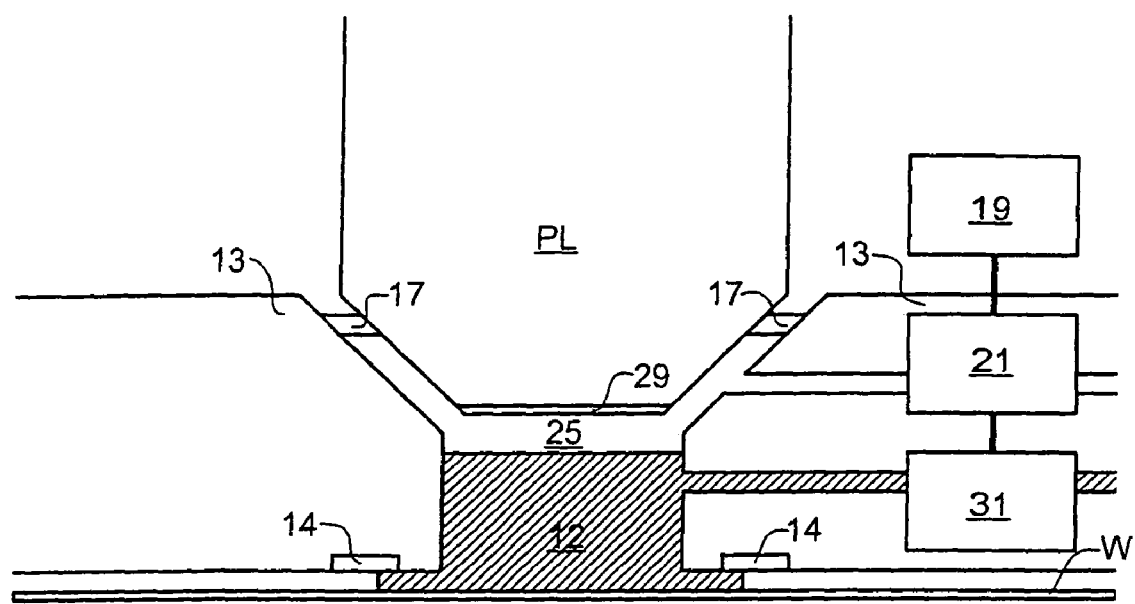
FIG. 10 depicts a projection apparatus comprising liquid pressure and liquid geometry controllers according to an embodiment of the invention.

One or more optical properties of the liquid in the space may also be varied by changing the geometry of the liquid. FIG. 10 shows an embodiment wherein the thickness of the liquid (as measured in a direction parallel to the axis of the final element of the projection system) is varied. In this embodiment, a liquid geometry controller 19 coordinates the operation of a liquid pressure controller 31 and a second-component pressure controller 21. The space between the final element of the projection system and the substrate is filled with a liquid 12 and a second component 25, which may be a gas such as air. The liquid and the second component may be constrained within the space by an upper seal member 17 and the contact-less seal 14. The thickness of the liquid, meaning the thickness of the liquid 12, is governed by the relative pressures of the liquid 12 and the second component 25, controlled in turn by the liquid pressure controller 31 and second-component pressure controller 21. The second component 25 need not be a gas and may be chosen to be a liquid with a different composition to the first. The relative amounts of the two components contained in the space between the final element of the projection system PL and the substrate W may be manipulated to control the position of the interface between the two and therefore one or more optical properties such as spherical aberration.

In an alternative or additional operational mode, the liquid pressure controller 31 may be operated independently to control the pressure of the liquid 12 and/or any flow of liquid in the space.

Figure 11:
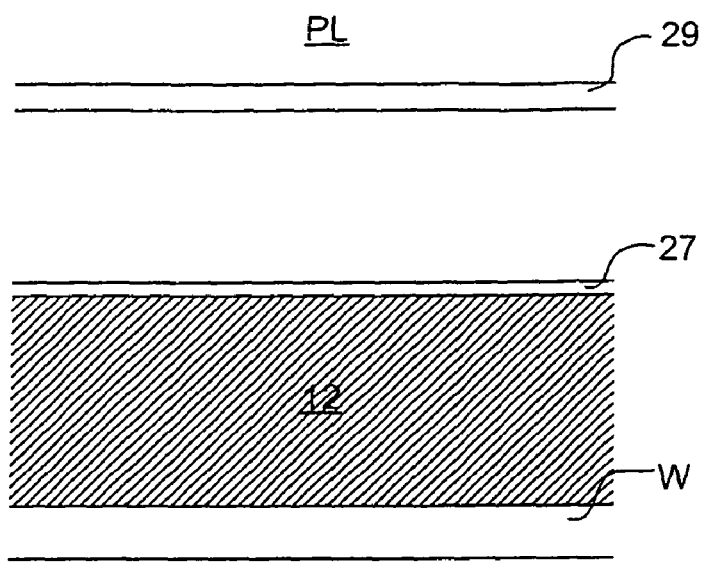
FIG. 11 depicts a liquid lens comprising a planar pellicle according to an embodiment of the invention.
Figure 12:
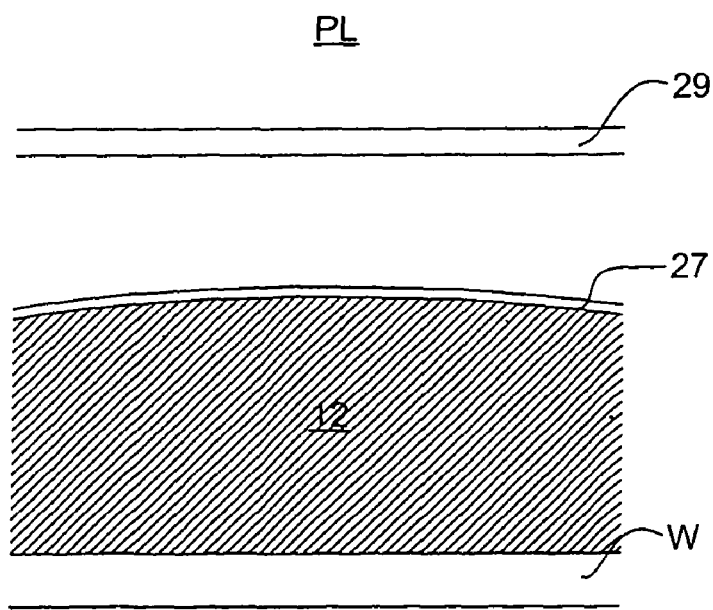
FIG. 12 depicts a liquid lens comprising a deformed constrained pellicle according to an embodiment of the invention.

FIGS. 11 and 12 show embodiments wherein a pellicle 27 (e.g. a foil of solid transparent material such as glass) is provided as an interface to the liquid in the space on a side of the liquid nearer the final element of the projection system PL. The pellicle may be laterally unconstrained (FIG. 11) in which case, in an arrangement such as that shown in FIG. 10, a planar interface is achieved, the pellicle acting to improve the optical smoothness of the interface and reduce unwanted scattering.

Alternatively, as shown in FIG. 12, the pellicle may be formed from a material that can be deformed and be constrained in such a way that an imbalance of pressure on either side of the pellicle causes deformation. In FIG. 12, a concave deformation is formed due to an overpressure in the liquid 12. As a further variation, the thickness and material of the pellicle 27 may be adjusted to provide further image manipulation.

Further possible variations include non-symmetrical deformation of either or both of the predominant interfaces to the liquid 12, such as by tilting one with respect to the other. In the arrangement in FIG. 11, for example, a device may be provided to tilt the pellicle 27.

Figure 13:
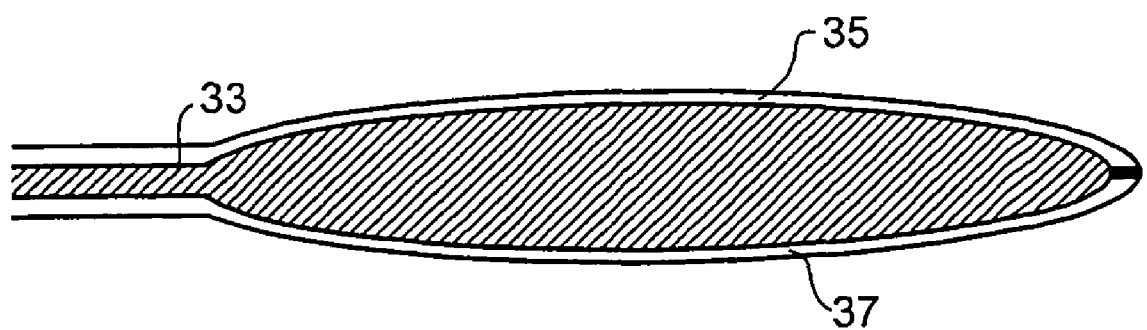
FIG. 13 depicts a liquid lens wherein the liquid is contained between two pellicles according to an embodiment of the invention.

The above embodiments have shown the liquid in the space formed from immersion liquid. However, the space may be anywhere in the beam path. As an example, FIG. 13 shows an alternative embodiment wherein the liquid 12 is constrained between two pellicles 35 and 37. The shape of the liquid formed in this way may be varied by adjusting the pressure of the liquid 12 via an inlet 33. Either or both of the pellicles 35 and 37 may be arranged to be flexible or rigid. A tuner may used to tune the optical property by, for example, configuring the shape of the liquid by controlling pressure and/or the shape of the pellicle(s).

Further, the final element of the projection system PL may consist of a plane parallel plate 29. The mounting of this plate may be such that it can move towards the substrate W, causing focus offset and/or spherical aberration offset. In addition, the plate 29 may be tilted, which leads to focus tilt and/or spherical aberration tilt. This may occur during scanning movements where a pressure gradient in the liquid 12 is established over the surface of the plate 29 (this may depend on how the plate 29 is secured to the rest of the projection system PL). Focus tilt may cause focus drilling (FLEX) and this may be manipulated by deliberately controlling the tilt of the plate 29. On the other hand, spherical aberration offset may be manipulated by controlling the overpressure of the liquid in the space, which affects the position of the plate 29 relative to the rest of the projection system.

While specific embodiments of the invention have been described above, it will be appreciated that the invention may be practiced otherwise than as described. The description is not intended to limit the invention.

The invention claimed is:

1. A lithographic projection apparatus, comprising:
a support structure configured to hold a patterning device, the patterning device configured to pattern a beam of radiation according to a desired pattern;
a substrate table configured to hold a substrate;
a projection system configured to project the patterned beam onto a target portion of the substrate;
a liquid supply system configured to supply a liquid to a space through which the beam of radiation passes, the liquid having an optical property that can be tuned; and
a tuner configured to control spatial dependence of the optical property of liquid in the space.

2. The apparatus of claim 1, wherein the tuner comprises a liquid temperature controller configured to control a temperature, and thereby one or more properties including the refractive index, absorptivity, or both, of liquid in the space.

3. The apparatus of claim 2, wherein the temperature controller comprises a heat exchanger configured to establish a non-uniform temperature profile within the liquid in the space.

4. The apparatus of claim 2, wherein the temperature controller comprises a plurality of independent heat exchangers arranged at different heights, radii, angles, or any combination of the foregoing, relative to an axis lying in a plane substantially parallel to the substrate.

5. The apparatus of claim 1, wherein the tuner comprises a liquid pressure controller configured to control the pressure, and thereby one or more properties including the refractive index, absorptivity, or both, of liquid in the space.

6. The apparatus of claim 1, wherein the tuner comprises a liquid geometry controller configured to control a shape of the liquid.

7. The apparatus of claim 6, wherein the liquid geometry controller is configured to control a thickness of the liquid in a direction substantially parallel to the axis of a final element of the projection system.

8. The apparatus of claim 1, wherein the tuner comprises a liquid composition controller configured to control the composition, and thereby one or more properties including the refractive index, absorptivity, or both, of the liquid in the space.

9. The apparatus of claim 1, configured to correct a focus of the apparatus as a function of the refractive index profile of the liquid in the space, as measured by a liquid sensor configured to measure, as a function of position, time, or both, a property of the liquid in the space.

10. The apparatus of claim 1, configured to correct an exposure dose of the apparatus as a function of the absorptivity profile of the liquid in the space, as measured by a liquid sensor configured to measure, as a function of position, time, or both, a property of the liquid in the space.

11. The apparatus of claim 1, wherein the tuner is arranged to create an optical effect including spherical aberration, field curvature, or both.

12. The apparatus of claim 1, wherein the tuner is arranged to create an anamorphic imaging effect by providing an anamorphic optical property profile.

13. The apparatus of claim 12, wherein the anamorphic imaging effect includes astigmatism offset, asymmetric lens magnification, or both.

14. A device manufacturing method, comprising:
providing a liquid in a space through which a beam of radiation passes;
controlling spatial dependence of an optical property of the liquid in the space; and
projecting the beam of radiation as patterned by a patterning device onto a target portion of a substrate.

15. The method of claim 14, wherein said controlling comprises controlling a temperature, and thereby one or more properties including the refractive index, absorptivity, or both, of liquid in the space.

16. The method of claim 15, wherein controlling the temperature comprises establishing a non-uniform temperature profile within the liquid in the space.

17. The method of claim 15, wherein controlling the temperature comprises establishing different homogeneous or non-uniform temperature profiles within the liquid in the space at different heights, radii, angles, or any combination of the foregoing relative to an axis lying in a plane substantially parallel to the substrate.

18. The method of claim 14, wherein tuning comprises controlling the pressure, and thereby one or more properties including the refractive index, absorptivity, or both, of liquid in the space.

19. The method of claim 14, wherein tuning comprises controlling a shape of the liquid in the space.

20. The method of claim 19, wherein controlling the shape comprises controlling a thickness of the liquid in the space in a direction substantially parallel to the axis of a final element of a projection system used to project the patterned beam.

21. The method of claim 14, wherein tuning comprises controlling the composition, and thereby one or more properties including the refractive index, absorptivity, or both, of liquid in the space.

22. The method of claim 14, comprising correcting a focus as a function of the refractive index profile of liquid in the space, based on a property of liquid in the space measured as a function of position, time, or both.

23. The method of claim 14, comprising correcting an exposure dose as a function of the absorptivity profile of liquid in the space, based on a property of liquid in the space measured as a function of position, time, or both.

24. The method of claim 14, wherein tuning comprises creating an optical effect including spherical aberration, field curvature, or both.

25. The method of claim 14, wherein tuning comprises creating an anamorphic imaging effect by providing an anamorphic optical property profile.

26. The method of claim 25, wherein the anamorphic imaging effect includes astigmatism offset, asymmetric lens magnification, or both.

27. A lithographic projection apparatus comprising:
a support structure configured to hold a patterning device, the patterning device configured to pattern a beam of radiation according to a desired pattern;
a substrate table configured to hold a substrate;
a projection system configured to project the patterned beam onto a target portion of the substrate;
a lens formed from a liquid and having an optical property that can be tuned, or a liquid supply system configured to supply a liquid to a space through which the beam of radiation passes, the liquid having an optical property that can be tuned, or both the lens and the liquid supply system; and
a tuner configured to spatially vary an optical property of the liquid.

28. The apparatus of claim 27, wherein the tuner comprises a liquid temperature controller configured to control a temperature, and thereby one or more properties including the refractive index, absorptivity, or both, of the liquid.

29. The apparatus of claim 28, wherein the temperature controller comprises a heat exchanger configured to establish a non-uniform temperature profile within the liquid.

30. The apparatus of claim 28, wherein the temperature controller comprises a plurality of independent heat exchangers arranged at different heights, radii, angles, or any combination of the foregoing, relative to an axis lying in a plane substantially parallel to the substrate.

31. The apparatus of claim 27, wherein the tuner comprises a liquid pressure controller configured to control the pressure, and thereby one or more properties including the refractive index, absorptivity, or both, of the liquid.

32. The apparatus of claim 27, wherein the tuner comprises a liquid geometry controller configured to control a shape of the liquid.

33. The apparatus of claim 27, wherein the tuner comprises a liquid composition controller configured to control the composition, and thereby one or more properties including the refractive index, absorptivity, or both, of the liquid.

34. The apparatus of claim 27, configured to correct a focus of the apparatus as a function of the refractive index profile of the liquid in the space, as measured by a liquid sensor configured to measure, as a function of position, time, or both, a property of the liquid in the space.

35. The apparatus of claim 27, configured to correct an exposure dose of the apparatus as a function of the absorptivity profile of the liquid in the space, as measured by a liquid sensor configured to measure, as a function of position, time, or both, a property of the liquid in the space.

36. The apparatus of claim 27, wherein the tuner is arranged to create an optical effect including spherical aberration, field curvature, or both.

37. The apparatus of claim 27, wherein the tuner is arranged to create an anamorphic imaging effect by providing an anamorphic optical property profile.

38. The apparatus of claim 37, wherein the anamorphic imaging effect includes astigmatism offset, asymmetric lens magnification, or both.

* * * * *